United States Patent
Sinanoglu et al.

(10) Patent No.: US 9,500,723 B2
(45) Date of Patent: Nov. 22, 2016

(54) MAGNETIC FIELD DETECTION DEVICE AND METHOD FOR DETECTING A MAGNETIC FIELD

(71) Applicant: Robert Bosch GmbH, Stuttgart (DE)

(72) Inventors: Tamer Sinanoglu, Reutlingen-Ohmenhausen (DE); Amin Jemili, Kusterdingen (DE)

(73) Assignee: Robert Bosch GmbH, Stuttgart (DE)

(*) Notice: Subject to any disclaimer, the term of this patent is extended or adjusted under 35 U.S.C. 154(b) by 189 days.

(21) Appl. No.: 14/051,858

(22) Filed: Oct. 11, 2013

(65) Prior Publication Data

US 2014/0103920 A1  Apr. 17, 2014

(30) Foreign Application Priority Data

Oct. 12, 2012  (DE) .................. 10 2012 218 609

(51) Int. Cl.
| | |
|---|---|
| *G01R 33/02* | (2006.01) |
| *G01R 33/04* | (2006.01) |
| *G01R 33/00* | (2006.01) |
| *G01R 33/028* | (2006.01) |
| *G01R 33/09* | (2006.01) |
| *G01R 33/038* | (2006.01) |

(52) U.S. Cl.
CPC ........... *G01R 33/04* (2013.01); *G01R 33/0005* (2013.01); *G01R 33/0052* (2013.01); *G01R 33/02* (2013.01); *G01R 33/0206* (2013.01); *G01R 33/028* (2013.01); *G01R 33/0023* (2013.01); *G01R 33/038* (2013.01); *G01R 33/09* (2013.01); *G01R 33/096* (2013.01)

(58) Field of Classification Search
CPC .. G01R 33/04; G01R 33/0023; G01R 33/02; G01R 33/0005; G01R 33/0052; G01R 33/0206; G01R 33/028; G01R 33/038; G01R 33/09; G01R 33/096
USPC ........... 324/51, 55, 200, 227, 228, 242, 243, 324/244, 247
See application file for complete search history.

(56) References Cited

U.S. PATENT DOCUMENTS

| | | | | |
|---|---|---|---|---|
| 2,388,070 | A * | 10/1945 | Middel ................ | G05B 11/016 323/336 |
| 2003/0094942 | A1* | 5/2003 | Friend .................... | G01C 17/30 324/244 |
| 2005/0024050 | A1* | 2/2005 | Na et al. ...................... | 324/253 |

(Continued)

FOREIGN PATENT DOCUMENTS

| | | |
|---|---|---|
| DE | 102008042800 | 4/2010 |
| DE | 102009045237 | 6/2011 |

*Primary Examiner* — Jermele M Hollington
*Assistant Examiner* — Raul Rios Russo
(74) *Attorney, Agent, or Firm* — Norton Rose Fulbright US LLP; Gerard Messina

(57) ABSTRACT

A magnetic field detection device and a corresponding method for detecting a magnetic field. The magnetic field detection device includes a coil core, a receiving coil coupled to the coil core, a plurality of electrically separated field coils coupled to the coil core, an excitation unit for generating a magnetic field excitation via a particular excitation current of the plurality of field coils coupled to the coil core and an evaluation unit for evaluating a magnetic field signal received via a receiving coil coupled to the coil core.

12 Claims, 4 Drawing Sheets

(56) References Cited

U.S. PATENT DOCUMENTS

| | | | |
|---|---|---|---|
| 2006/0026849 A1* | 2/2006 | Lee et al. .................... 33/356 |
| 2011/0140694 A1* | 6/2011 | Cima ................... G01R 33/04 324/253 |
| 2011/0241665 A1* | 10/2011 | Takatsuji .................. 324/253 |
| 2012/0313633 A1* | 12/2012 | Schatz ................ G01R 33/04 324/225 |
| 2013/0127449 A1* | 5/2013 | Backes ................ G01D 5/2291 324/207.18 |
| 2013/0134964 A1* | 5/2013 | Ahrentorp ............. G01R 33/16 324/201 |
| 2013/0214777 A1* | 8/2013 | Itoi ............................. 324/252 |
| 2013/0294110 A1* | 11/2013 | Eyales .......................... 363/15 |
| 2015/0077101 A1* | 3/2015 | Oikawa ....................... 324/258 |

\* cited by examiner

MAGNETIC FIELD DETECTION DEVICE AND METHOD FOR DETECTING A MAGNETIC FIELD

FIELD OF THE INVENTION

The present invention relates to a magnetic field detection device and a corresponding method for detecting a magnetic field.

BACKGROUND INFORMATION

Hall sensors, fluxgate sensors or flipcore sensors are presently used in consumer electronics to detect a direction and/or strength of a magnetic field. The sensor element usually includes a closed or open ferromagnetic core, a field coil with single or multiple windings, and a detection coil with single or multiple windings. A control circuit of this type of sensor element normally generates a periodic signal from a corresponding source. The control circuit is independent of the position of the sensor element. Thus, in such cases the sensor element may be situated on the same semiconductor material or also on one or multiple materials/substrates. The control circuit of the particular sensors is usually limited to a current starting circuit for one sensor element via two terminals. Two additional terminals are used for the detection coil. A single control circuit may be used, for example, in multiplexed form for multiple sensor elements.

A device is described in German Published Patent Appln. No. 10 2008 042 800 for measuring a direction and/or strength of a magnetic field which has a first sensor for detecting a first component of the magnetic field in a first spatial direction and a second sensor for detecting a second component of the magnetic field in a second spatial direction and a third sensor for detecting a third component of the magnetic field in a third spatial direction. The first sensor includes at least one Hall sensor and the second and/or third sensor include(s) at least one fluxgate sensor.

An evaluation circuit for compensating Barkhausen noise during the magnetic field measurement is described in German Patent No. 10 2009 045 237.

When it comes to high activating currents, present-day circuit topologies are pushed to their limits, since they are unable to achieve a sufficient drive capability. The limited drive capability is related to the resistance of the sensor element. The number of coil windings of the field coil determines the magnitude of the generatable/detectable magnetic field; however, though multiple windings of a coil bring an improvement with regard to the detection of higher magnetic fields, they bring major disadvantages for the control circuit due to the increase in the coil resistance.

SUMMARY

The concept underlying the present invention involves operating multiple field coils simultaneously with the aid of a single control circuit unit. This makes it possible, therefore, to provide a cost-effective and space-saving partitioning of the field coils and an adapted control circuit unit with corresponding coupling circuits, whereby the magnetic field detection device according to the present invention is suitable, in particular, for battery-powered consumer electronic devices. When compared to known current starting circuits and field coils, it is possible here to detect a higher magnetic field over the same surface area using a very low supply voltage, for example, an aforementioned battery voltage.

According to the present invention the coupling of the excitation, for example, an oscillating current signal, is distributed to a plurality of electrically separated coils, each coil preferably supplying the same excitation signal. Thus, on the whole, the excitation signals of the individual coils are added up without causing increased power consumption.

The new way of partitioning the excitation device may be expanded arbitrarily, or the individual field coils may be fed selectively in order to thereby generate different magnetic field strengths. This arbitrary expandability and independence may be used to measure magnetic fields of any strength, even in conjunction with low supply voltages as in the case of batteries, for example. Coil resistance is no longer a limiting factor.

According to a preferred specific embodiment, the excitation device is designed in such a way that it may selectively generate the magnetic field excitation via a subgroup of the plurality of field coils coupled to the coil core. This enhances flexibility.

According to another preferred specific embodiment, the excitation device includes a control circuit unit and a plurality of coupling circuits, each of which are electrically connected to the control circuit unit, and each coupling circuit being electrically connected to an associated field coil. In this way, only the coupling circuit and not the control circuit unit has to be multiplied, which is enormously space-saving for the control circuit unit. Furthermore, the coil core in this configuration may be composed of a single element.

According to another preferred specific embodiment, each of the coupling circuits includes a driver device for driving a particular field coil current which is responsive to a particular control signal of the control circuit unit.

According to another preferred specific embodiment, each of the driver devices includes a transistor device that is connected between a first and a second reference potential, for example a battery voltage. The resulting adaptability in conjunction with low supply voltages results at the same time in achievement of higher performance with the same power consumption, in no overall size limitations and in lower costs. With integrated sensor elements on the same semiconductor material, cost savings may at the same time be achieved as a result of lower wiring costs.

According to another preferred specific embodiment, the control signals are routed in parallel from the control circuit unit to the control terminals of the transistor device.

According to another preferred specific embodiment, one switching element each is connected upstream from the control terminals of the transistor devices, the control signals being routed in parallel from the control circuit unit to the switching elements and a common control signal being routed from the control circuit unit to the switching elements.

According to another preferred specific embodiment, the evaluation unit is designed in such a way that it may determine a magnetic field strength and/or a magnetic field direction based on the evaluated magnetic field signals.

According to another preferred specific embodiment, all excitation currents are essentially the same and/or all field coils exhibit essentially the same coil resistance. This simplifies the manufacture.

DETAILED DESCRIPTION

Figure 1:
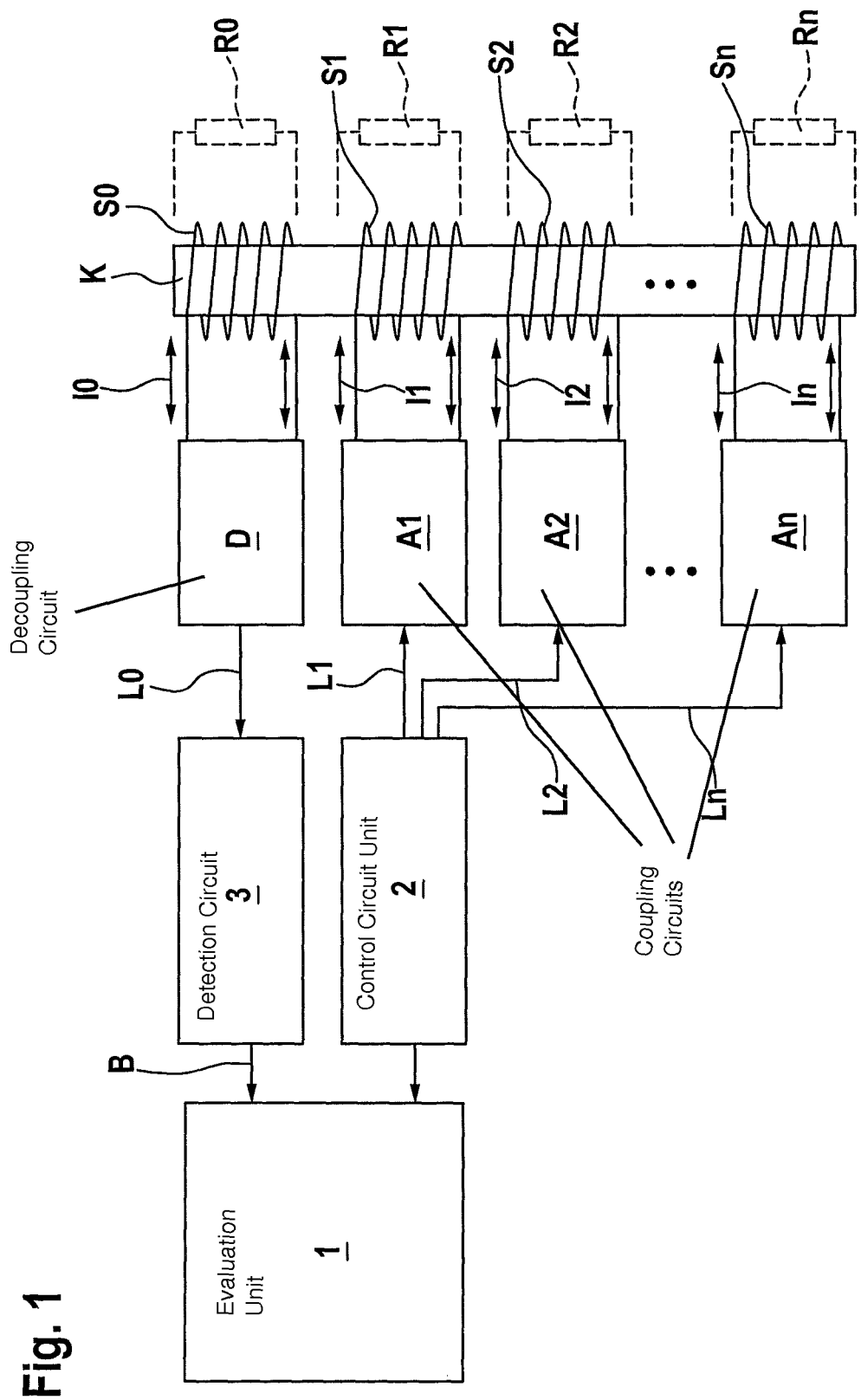
FIG. 1 shows a schematic block diagram of a magnetic field detection device according to a first specific embodiment of the present invention.

Identical reference numerals denote identical or functionally identical elements.

FIG. 1 shows a schematic block diagram of a magnetic field detection device according to a first specific embodiment of the present invention.

Reference symbol K in FIG. 1 denotes a ferromagnetic coil core that includes a receiver coil S0 coupled to coil core K, the coil resistance of which is denoted by R0. An excitation of coil core K may be detected by a current I0 induced in receiving coil S0 via a decoupling circuit D which supplies a corresponding signal L0 to a detection circuit 3. A magnetic field signal B derived therefrom is supplied by detection circuit 3 to an evaluation unit which ascertains, for example, a magnetic field strength and/or a magnetic field direction on the basis of the magnetic field signal B.

The excitation occurs via a plurality of electrically separated field coils S1 through Sn which are coupled to coil core K, the coil resistances of the field coils being denoted by R1 through Rn. In the present example, all field coils S1 through Sn are of equal dimensions and exhibit an essentially identical coil resistance. Excitation currents I1 through In are fed into field coils S1 through Sn via coupling circuits A1 through An, in the present example all excitation currents I1 through In being essentially identical, for example, periodically sinusoidal or triangular.

In addition, coupling circuits A1 through An receive control signals L1 through Ln from a control circuit unit 2. Control circuit unit 2 makes it possible to supply either all of field coils S1 through Sn simultaneously or to supply selectively a subgroup of field coils S1 through Sn. It is also possible, for example, that the control circuit unit 2 only generates a subgroup of control signals L1 through Ln.

Figure 2:
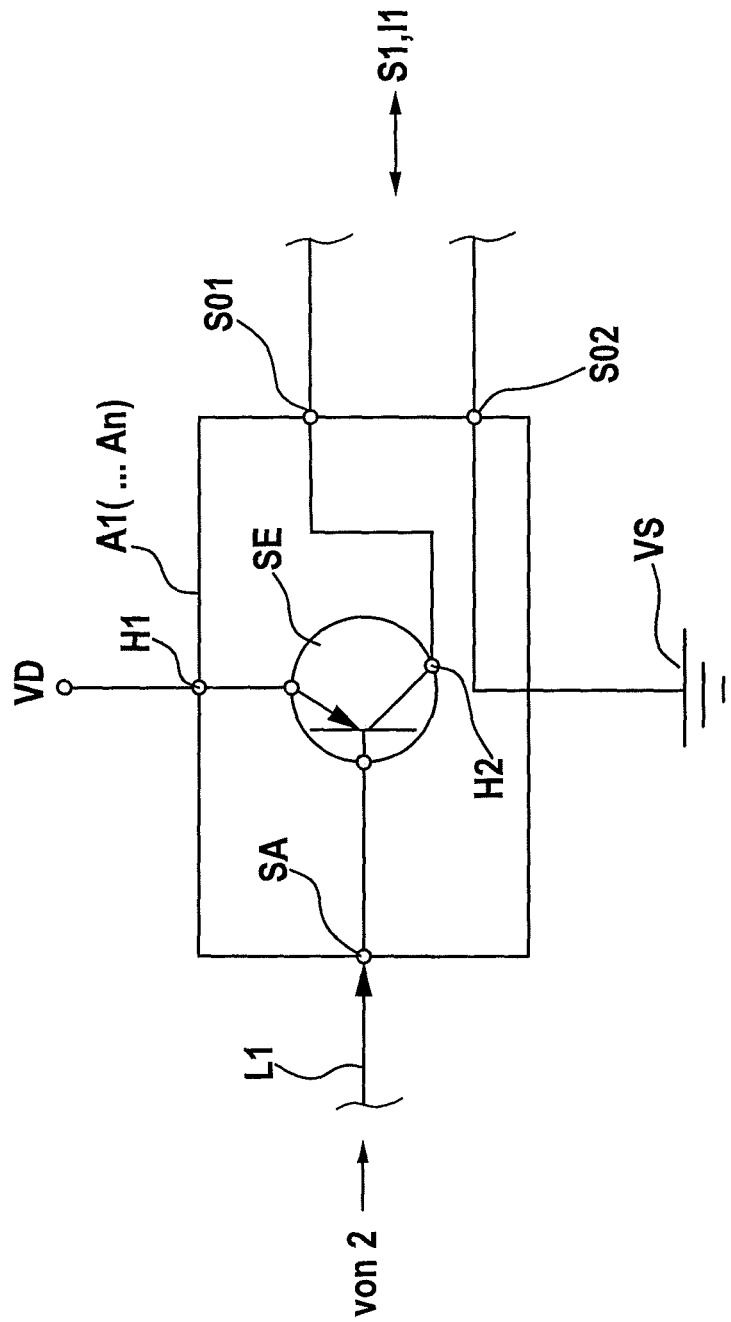
FIG. 2 shows a schematic representation of the decoupling devices A1 through An according to FIG. 1.

FIG. 2 shows a schematic representation of the decoupling devices A1 through An according to FIG. 1.

In FIG. 2, reference symbol SE denotes a transistor device which is connected at its main terminals H1, H2 between a first reference potential VD and a second reference potential VS, for example, similar to a battery voltage. In this arrangement, field coil S1 between main terminal H2 and second reference potential VS is connected between terminals S01 and S02 in order to couple a magnetic field component corresponding to excitation current I1 into coil core K. Control terminal SA of transistor device SE is connected to control signal L1 of control circuit unit 2. This allows excitation current I1 as well as all other excitation currents I2 through In to be generated using very little drive power, supplied for example by a battery.

If one coupling circuit of coupling circuits A1 through An is not to be activated, for example, in order to generate a lower magnetic field, control circuit unit 2 simply ensures that the relevant control signal is not output. In other words, it may be selectively determined which of coupling circuits A1 through An is activated, for example, via an input device (not shown) or an internal wiring of control circuit unit 2.

Figure 3:
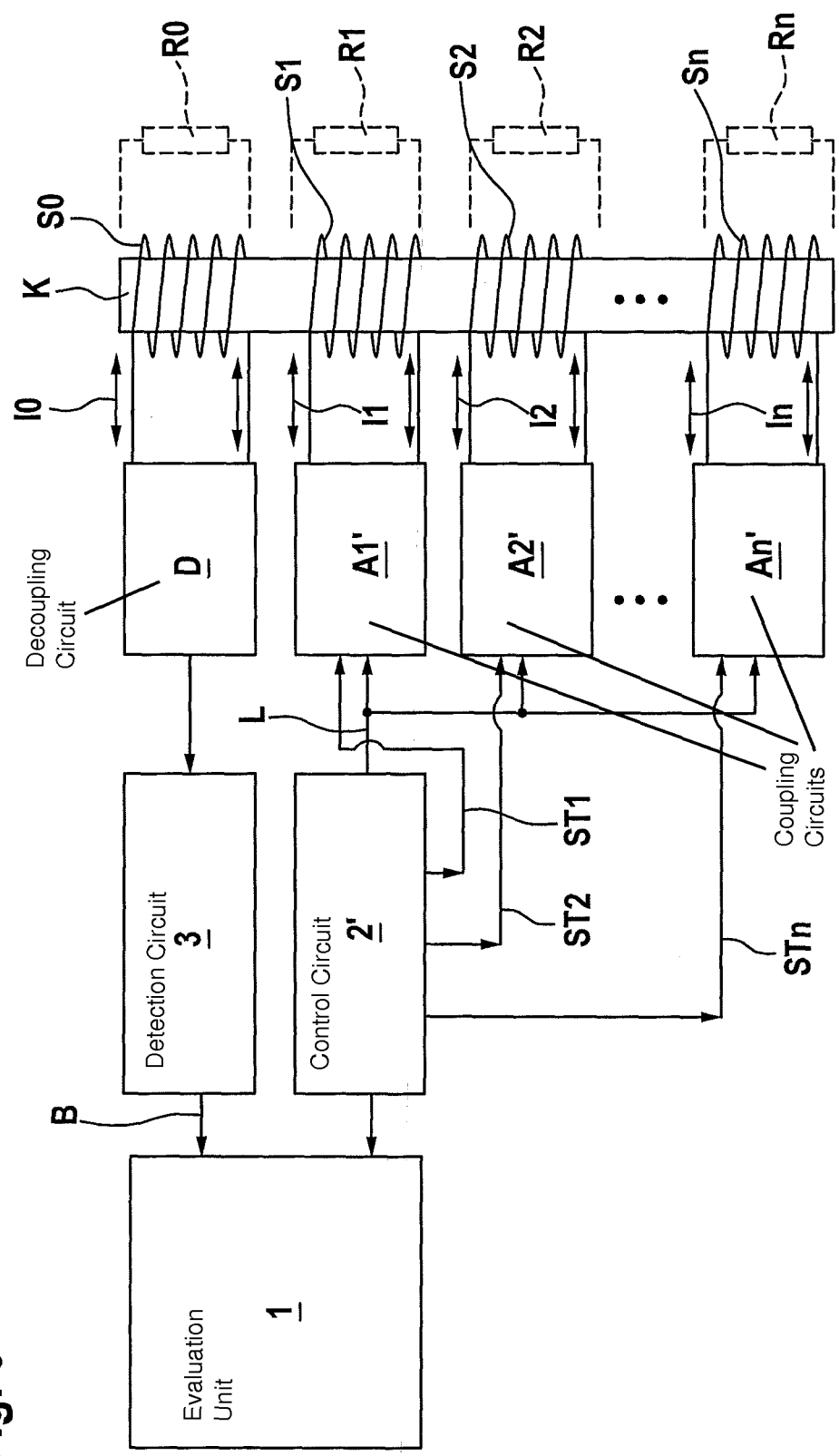
FIG. 3 shows a schematic block diagram of a magnetic field detection device according to a second specific embodiment of the present invention.

FIG. 3 shows a schematic block diagram of a magnetic field detection device according to a second specific embodiment of the present invention.

Control circuit unit 2' as well as coupling circuits A1' through An' of the second specific embodiment according to FIG. 3 are designed differently from those in the first exemplary embodiment according to FIG. 1.

Figure 4:
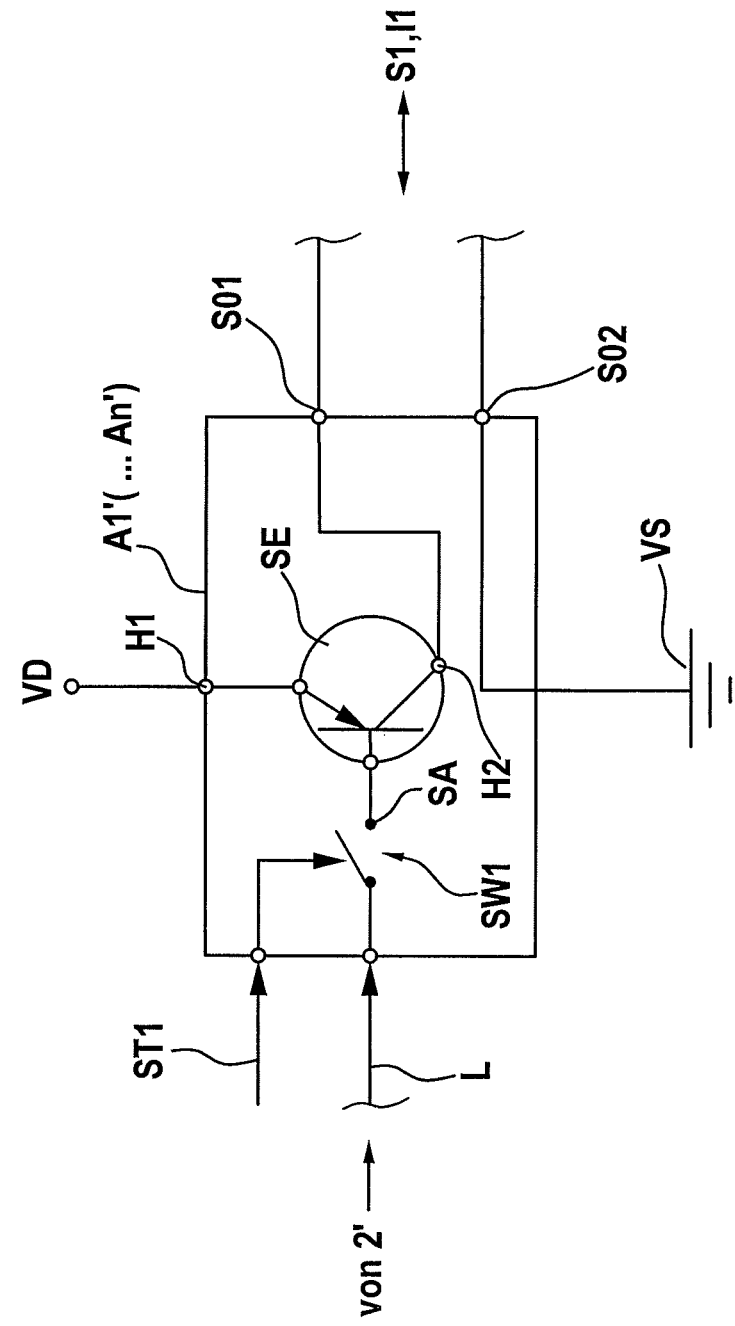
FIG. 4 shows a schematic representation of the decoupling devices A1' through An' according to FIG. 3.

FIG. 4 shows a schematic representation of decoupling devices A1' through An' according to FIG. 3 and activation thereof by control circuit unit 2'.

Coupling circuits A1' through An' also include a transistor device SE as was previously described in connection with FIG. 2; however, a switching element SE1 is connected upstream from transistor device SE with which control terminal SA of transistor device SE may be selectively supplied with a common control signal L, which is applied to all coupling circuits A1' through An'.

For this purpose, control signals ST1 through STn are applied by control circuit unit 2' to the particular switches of coupling circuits A1' through An'.

This second specific embodiment also has the advantage that with little power a plurality of field coils may be operated simultaneously for activating a magnetic field of desired strength.

The present invention, though fully described above with reference to preferred exemplary embodiments, is not limited thereto, and is modifiable in a variety of ways.

What is claimed is:

1. A magnetic field detection device, comprising:
   a coil core;
   a receiving coil directly coupled to the coil core;
   a plurality of electrically separated field coils directly coupled to the coil core;
   an excitation unit for generating a magnetic field excitation via a particular excitation current of the plurality of field coils directly coupled to the coil core; and
   an evaluation unit for evaluating a magnetic field signal received via the receiving coil directly coupled to coil core.

2. The magnetic field detection device as recited in claim 1, wherein the excitation unit selectively generates the magnetic field excitation via a subgroup of the plurality of field coils directly coupled to the coil core.

3. The magnetic field detection device as recited in claim 1, wherein:
   the excitation unit includes a control circuit unit and a plurality of coupling circuits, each of which is electrically connected to the control circuit unit, and
   each coupling circuit is electrically connected to an associated field coil.

4. The magnetic field detection device as recited in claim 3, wherein each of the coupling circuits includes a driver device for driving a particular field coil current responsive to a particular control signal of the control circuit unit.

5. The magnetic field detection device as recited in claim 4, wherein each of the driver devices includes a transistor device connected between a first and a second reference potential.

6. The magnetic field detection device as recited in claim 5, wherein the control signals are routed in parallel from the control circuit unit to control terminals of the transistor devices.

7. The magnetic field detection device as recited in claim 6, further comprising:
   a plurality of switching elements connected upstream from the control terminals of the transistor devices, wherein the control signals are routed in parallel from the control circuit unit to the switching elements, and wherein a common control signal is routed from the control circuit unit to the switching elements.

8. The magnetic field detection device as recited in claim 1, wherein the evaluation unit determines at least one of a magnetic field strength and a magnetic field direction on the basis of the evaluated magnetic field signal.

9. The magnetic field detection device as recited in claim 1, wherein all excitation currents are essentially identical.

10. The magnetic field detection device as recited in claim 1, wherein all field coils exhibit essentially the same coil resistance.

11. The magnetic field detection device as recited in claim 1, wherein the excitation unit is battery-powered.

12. A magnetic field detection method, comprising:
generating a magnetic field excitation via a particular excitation current of a plurality of electrically separated field coils directly coupled to a coil core; and
evaluating a magnetic field signal received via a receiving coil directly coupled to the coil core.

\* \* \* \* \*